(12) United States Patent
Barowski et al.

(10) Patent No.: US 10,223,489 B2
(45) Date of Patent: Mar. 5, 2019

(54) PLACEMENT CLUSTERING-BASED WHITE SPACE RESERVATION

(71) Applicant: International Business Machines Corporation, Armonk, NY (US)

(72) Inventors: Harry Barowski, Boeblingen (DE); Ajith Kumar M. Chandrasekaran, Bangalore (IN); Harald D. Folberth, Boeblingen (DE); Joachim Keinert, Altdorf (DE); Sourav Saha, Kolkata (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/364,716

(22) Filed: Nov. 30, 2016

(65) Prior Publication Data

US 2018/0150584 A1    May 31, 2018

(51) Int. Cl.
*G06F 17/50* (2006.01)
(52) U.S. Cl.
CPC ...... *G06F 17/5072* (2013.01); *G06F 17/5077* (2013.01); *G06F 17/5081* (2013.01)
(58) Field of Classification Search
CPC ............. G06F 17/5072; G06F 17/5081; G06F 17/5077
See application file for complete search history.

(56) References Cited

U.S. PATENT DOCUMENTS

| | | | |
|---|---|---|---|
| 6,009,248 A * | 12/1999 | Sato | G06F 17/5068 716/114 |
| 6,523,159 B2 * | 2/2003 | Bernstein | G06F 17/5036 716/115 |
| 6,543,040 B1 | 4/2003 | Bednar et al. | |
| 6,564,362 B2 * | 5/2003 | Osaki | G01R 31/318538 257/E27.105 |
| 6,934,924 B2 * | 8/2005 | Paul | G06F 17/5068 716/114 |
| 6,996,512 B2 * | 2/2006 | Alpert | G06F 17/5072 703/14 |

(Continued)

OTHER PUBLICATIONS

Chen et al., "Floorplanning with Consideration of White Space Resource Distribution for Repeater Planning", Proceedings of the Sixth International Symposium on Quality Electronic Design, 2005, pp. 1-6.

(Continued)

*Primary Examiner* — Naum B Levin
(74) *Attorney, Agent, or Firm* — Cantor Colburn LLP; Margaret A. McNamara

(57) ABSTRACT

A system and method place unit-level components in a macro within a unit of an integrated circuit that includes two or more of the units that each include two or more of the macros. The method includes detecting white space in a congestion plot of the macro. The white space represents potential placement areas for the unit-level components. The method also includes performing wire reach analysis between sources and sinks on different sides of the macro to determine an allowable region for the unit-level components, and deriving a buffer and latch placement reservation area in which to place the unit-level components based on the white space and the allowable region.

20 Claims, 12 Drawing Sheets

(56) References Cited

U.S. PATENT DOCUMENTS

| | | | |
|---|---|---|---|
| 7,089,521 B2 | 8/2006 | Kurzum et al. | |
| 7,111,266 B2* | 9/2006 | Correale, Jr. | G06F 17/5045 |
| | | | 257/E27.105 |
| 7,127,696 B2* | 10/2006 | Alpert | G06F 17/505 |
| | | | 716/114 |
| 7,137,081 B2* | 11/2006 | Alpert | G06F 17/5077 |
| | | | 716/114 |
| 7,904,840 B2 | 3/2011 | Tang | |
| 8,010,926 B2* | 8/2011 | Alpert | G06F 17/5077 |
| | | | 716/120 |
| 8,104,014 B2* | 1/2012 | Puri | G06F 17/5077 |
| | | | 716/100 |
| 8,112,731 B1 | 2/2012 | Shen et al. | |
| 8,239,797 B1 | 8/2012 | Ghosh et al. | |
| 8,271,920 B2* | 9/2012 | Cho | G06F 17/5068 |
| | | | 716/104 |
| 8,296,707 B2* | 10/2012 | Amundson | G06F 17/5072 |
| | | | 716/118 |
| 8,381,159 B2* | 2/2013 | Kondou | G06F 17/5068 |
| | | | 716/113 |
| 8,516,412 B2* | 8/2013 | Cho | G06F 17/5072 |
| | | | 716/100 |
| 8,566,774 B2* | 10/2013 | Daellenbach | G06F 13/4027 |
| | | | 716/126 |
| 8,631,375 B2 | 1/2014 | Arelt et al. | |
| 8,875,084 B1* | 10/2014 | Ankenapalli | G06F 17/5072 |
| | | | 716/136 |
| 9,123,721 B2 | 9/2015 | Samadi et al. | |
| 9,171,112 B2* | 10/2015 | Kalpat | G06F 17/5031 |
| 10,048,739 B2* | 8/2018 | Liu | G06F 1/3234 |
| 2003/0229878 A1* | 12/2003 | Nuber | G06F 17/5072 |
| | | | 716/114 |
| 2004/0049753 A1* | 3/2004 | Kabuo | G06F 17/5022 |
| | | | 716/102 |
| 2012/0297355 A1 | 11/2012 | Alpert et al. | |
| 2015/0213188 A1* | 7/2015 | Chowdhury | G06F 17/5081 |
| | | | 716/114 |
| 2017/0212970 A1* | 7/2017 | Barowski | G06F 17/505 |

OTHER PUBLICATIONS

Li et al., "Routability-Driven Placement and White Space Allocation", IEEE Transactions on Computer-Aided Design of Integrated Circuits and Systems, vol. 26, No. 5, May 2007, pp. 858-871.

Li et al., "Whitespace-Aware TSV Arrangement in 3D Clock Tree Synthesis", 2013 IEEE Computer Society Annual Symposium on VLSI, 2013, pp. 115-120.

* cited by examiner

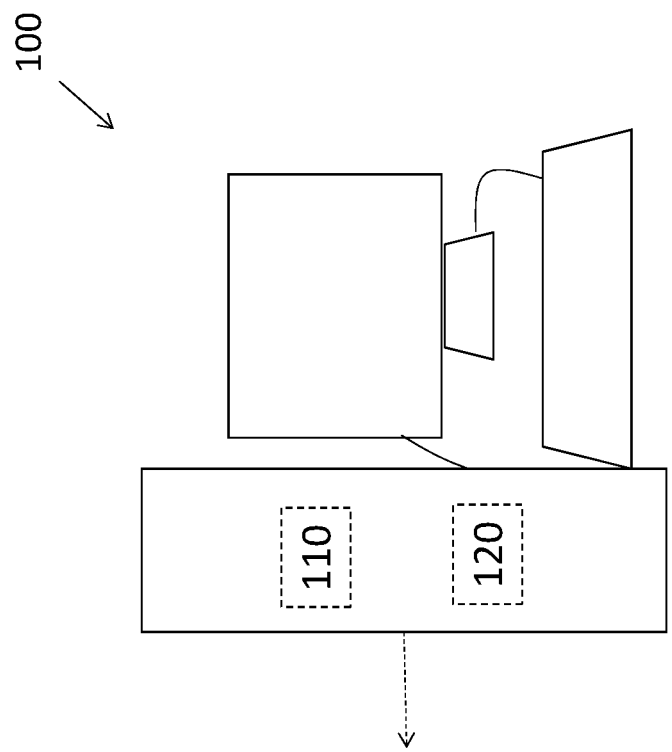
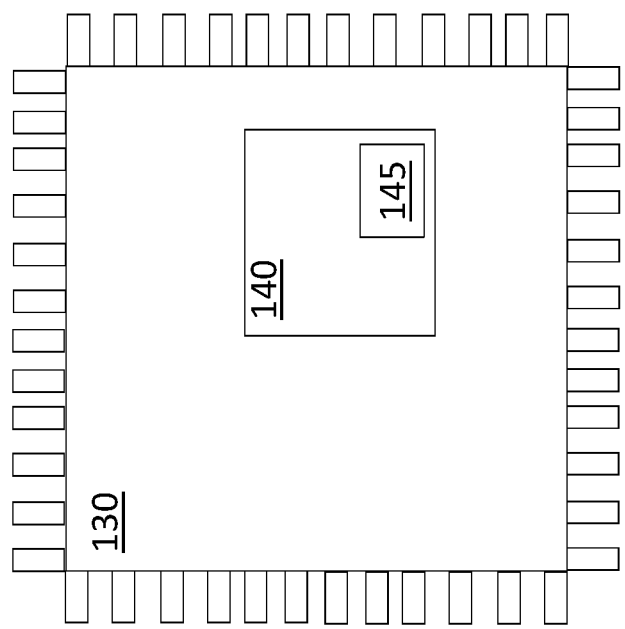
FIG. 1

PLACEMENT CLUSTERING-BASED WHITE SPACE RESERVATION

BACKGROUND

The present invention relates to very large scale integration (VLSI) design, and more specifically, to placement clustering-based white space reservation.

A VLSI design is typically subdivided into hierarchical components that can be designed concurrently. For example, a chip is divided into a number of units, and a number of macros, which can be referred to as large blocks, make up each unit of the chip. The design cycle includes several phases from the logic design to the physical implementation of a chip. For example, in the high-level design phase, synthesis is a process by which desired functionality is mapped to logic gates. In floorplanning, areas of the chip are designated for different components. As the logic density of chips increases, the size and aspect ratio of each large block also increases. As a result, the large blocks dominate the area defining the unit, leaving little or no room between macros for the latches and buffers that address unit level constraints.

SUMMARY

According to an embodiment of the present invention, a method of placing unit-level components in a macro within a unit of an integrated circuit that includes two or more of the units that each include two or more of the macros includes detecting white space in a congestion plot of the macro. The white space represents potential placement areas for the unit-level components. The method also includes performing wire reach analysis between sources and sinks on different sides of the macro to determine an allowable region for the unit-level components, and deriving a buffer and latch placement reservation area in which to place the unit-level components based on the white space and the allowable region.

According to another embodiment, a system to place unit-level components in a macro within a unit of an integrated circuit that includes two or more of the units that each include two or more of the macros includes a memory device to store a congestion plot of the macro, and a processor to detect white space in the congestion plot, perform wire reach analysis between sources and sinks on different sides of the macro to determine an allowable region for the unit-level components, and derive a buffer and latch placement reservation area in which to place the unit-level components based on the white space and the allowable region. The white space represents potential placement areas for the unit-level components.

According to yet another embodiment, a computer program product places unit-level components in a macro within a unit of an integrated circuit that includes two or more of the units that each include two or more of the macros. The computer program product includes a computer readable storage medium having program instructions embodied therewith The program instructions are executable by a processor to perform a method that includes detecting white space in a congestion plot of the macro. The white space represents potential placement areas for the unit-level components. The method also includes performing wire reach analysis between sources and sinks on different sides of the macro to determine an allowable region for the unit-level components, and deriving a buffer and latch placement reservation area in which to place the unit-level components based on the white space and the allowable region.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1 is a block diagram of a system 100 according to one or more embodiments of the invention;

DETAILED DESCRIPTION

Figure 2:
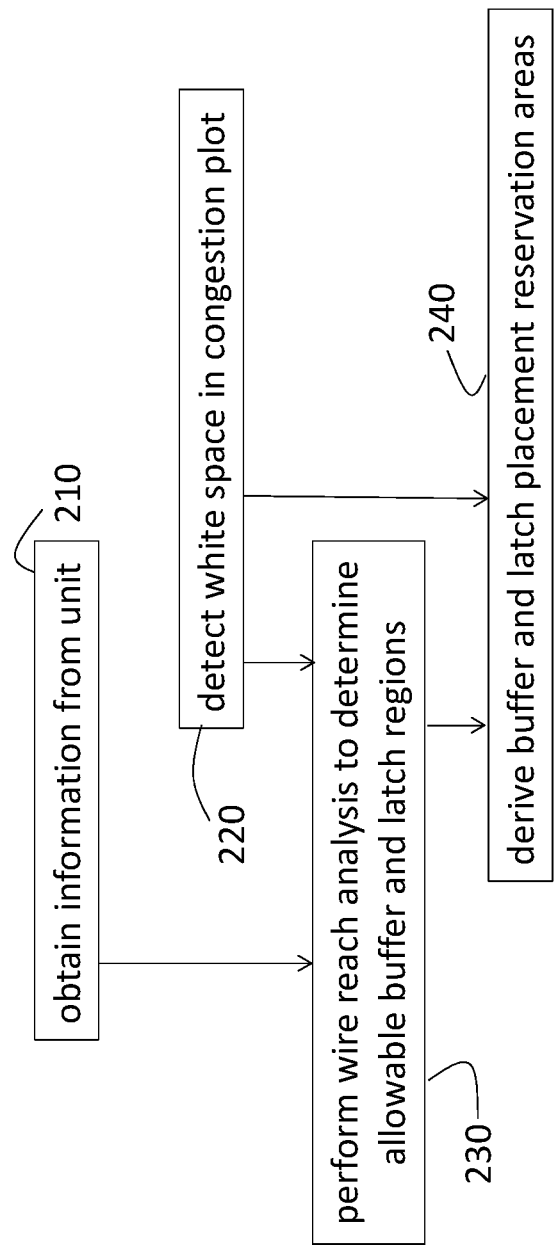
FIG. 2 is a process flow of a method of deriving the white space reservation areas within a macro according to one or more embodiments.

As previously noted, the increasing size of large blocks within units means that latches and buffers of the unit cannot be placed between the large blocks as they previously were. As a result, these components must be absorbed within the large block macro floor plan. A prior approach to planning for the latches and buffers required to address unit constraints involves the unit reserving a zone within the macro for placement of these components. However, this approach does not take into account the timing and routability objectives of the large block macros. Embodiments of the systems and methods detailed herein relate to accumulating white spaces within the large blocks, determining allowable buffer and latch regions based on information from the unit, and intersecting the white spaces with the allowable region to derive buffer and latch placement reservation areas that address the needs of both the unit and the macro.

FIG. 1 is a block diagram of a system 100 according to one or more embodiments of the invention. The system 100 includes one or more memory devices 110 (e.g., computer readable storage medium) and one or more processors 120 used to design an integrated circuit and the resulting physical implementation of the integrated circuit 130. Multiple of the processors 120 may be used in the white space reservation processes detailed below. The memory device 110 stores instructions implemented by the processor 120. The integrated circuit 130 includes components that are organized into units 140 that are further subdivided into macros 145. As further discussed below, the instructions stored in the memory device 110 include processes used to derive the white space reservation areas. According to the embodiments detailed below, the memory device 110 may additionally store the information generated from the processes detailed in FIG. 2 below.

FIG. 2 is a process flow of a method of deriving the buffer and latch placement reservation areas 1010 (FIG. 10) within a macro 145 according to one or more embodiments. At block 210, the processes include obtaining information from the unit 140. This information includes properties of wires at each level, sink 620 (FIG. 6) and source 610 (FIG. 6) locations, and slew and slope values. The information about properties of the wires, for example, indicates wire reach or the allowable length of a given type of wire at a given metal layer. As FIG. 2 indicates, the information from the unit is used to determine the allowable buffer and latch regions 730 at block 230.

At block 220, detecting white space (410, FIG. 4) in the congestion plot (300, FIG. 3) for the macro 145 is further discussed with reference to FIGS. 3 and 4. The congestion plot 300 can be stored in the memory device 110, for example. Performing wire reach analysis, at block 230, indicates one or more areas where the buffers and latches can be placed. These areas are referred to as allowable buffer and latch regions 730 in the discussion with reference to FIG. 7. The wire reach analysis process and determination of allowable buffer and latch regions 730 is detailed with reference to FIGS. 5 through 9. At block 240, deriving buffer and latch placement reservation areas 1010 is based on an overlap between the white space 410 determined at block 220 and the allowable buffer and latch regions 730 resulting from the wire reach analysis (at block 230).

Figure 3:
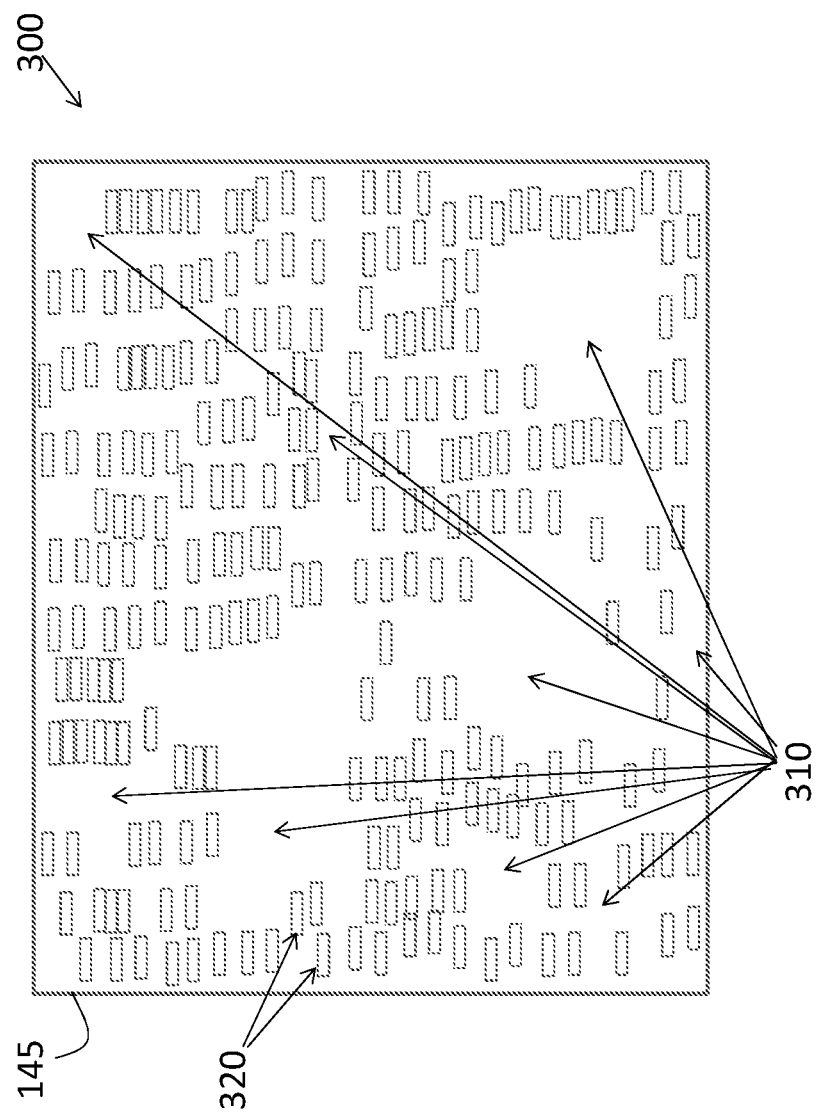
FIG. 3 is a congestion plot of an exemplary macro in which white space reservation areas are identified according to one or more embodiments.

FIG. 3 is a congestion plot 300 of an exemplary macro 145 in which buffer and latch placement reservation areas 1010 are identified according to one or more embodiments. Components 320 that are part of the macro 145 are indicated. These components 320 include logical components and metal layer tracks arranged in multiple circuit rows. The buffers and latches that are placed in the macro 145 according to the embodiments herein must snap into a circuit row and align with metal layer tracks. A utilization analysis is performed to identify low-utilization areas 310. A low-utilization area 310 can be defined as a contiguous region within the macro 145 with utilization below a threshold value (e.g., 50%). This threshold value of utilization can be adjusted to ensure that some of the buffer and latch placement reservation areas 1010 that are ultimately determined can accommodate macro-level use, as well as unit-level use. For example, less than 20% utilization (rather than 50%) can be required to designate a region as a low-utilization area 310. The adjustment can be user-defined, for example. According to an alternate embodiment, wire congestion (i.e., wire utilization for each metal layer) rather than congestion of logic components can be used to determine the low-utilization areas 310.

Figure 4:
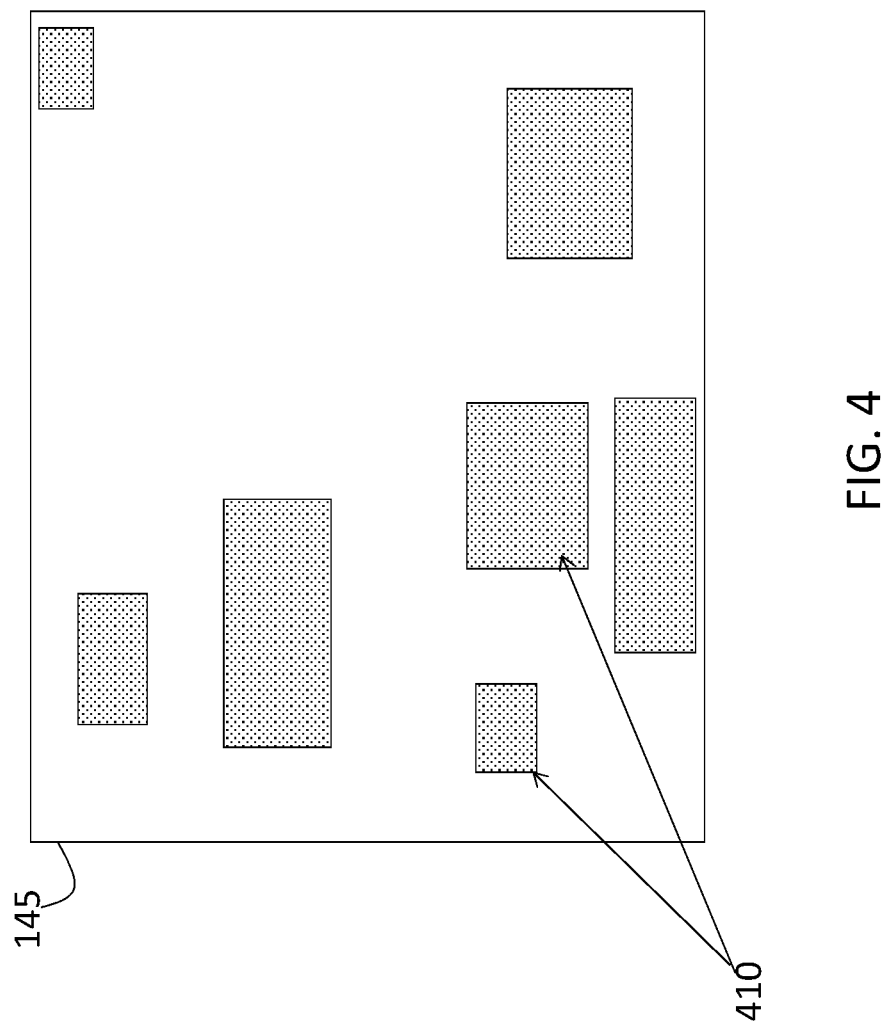
FIG. 4 indicates white spaces that are used to determine white space reservation areas according to one or more embodiments.

FIG. 4 indicates white spaces 410 that are used to determine buffer and latch placement reservation areas 1010 according to one or more embodiments. The components 320 are not shown in FIG. 4 for purposes of clarity. However, the white spaces 410 are derived from and correspond with the low-utilization areas 310 shown in FIG. 3. The white spaces 410 can be derived from the low-utilization areas 310 in a number of ways. According to an exemplary embodiment, after each low-utilization area 310 is identified according to the threshold utilization value, the center of gravity of the low-utilization area 310 is computed. The center of gravity computation is a sum integral of the product of utilization. A first order of approximation is used to identify elliptical regions of low utilization and a second order of approximation is used to obtain the rectangles indicated as white spaces 410 in FIG. 4. The rectangles have the same area and aspect ratio as the elliptical regions.

Figure 5:
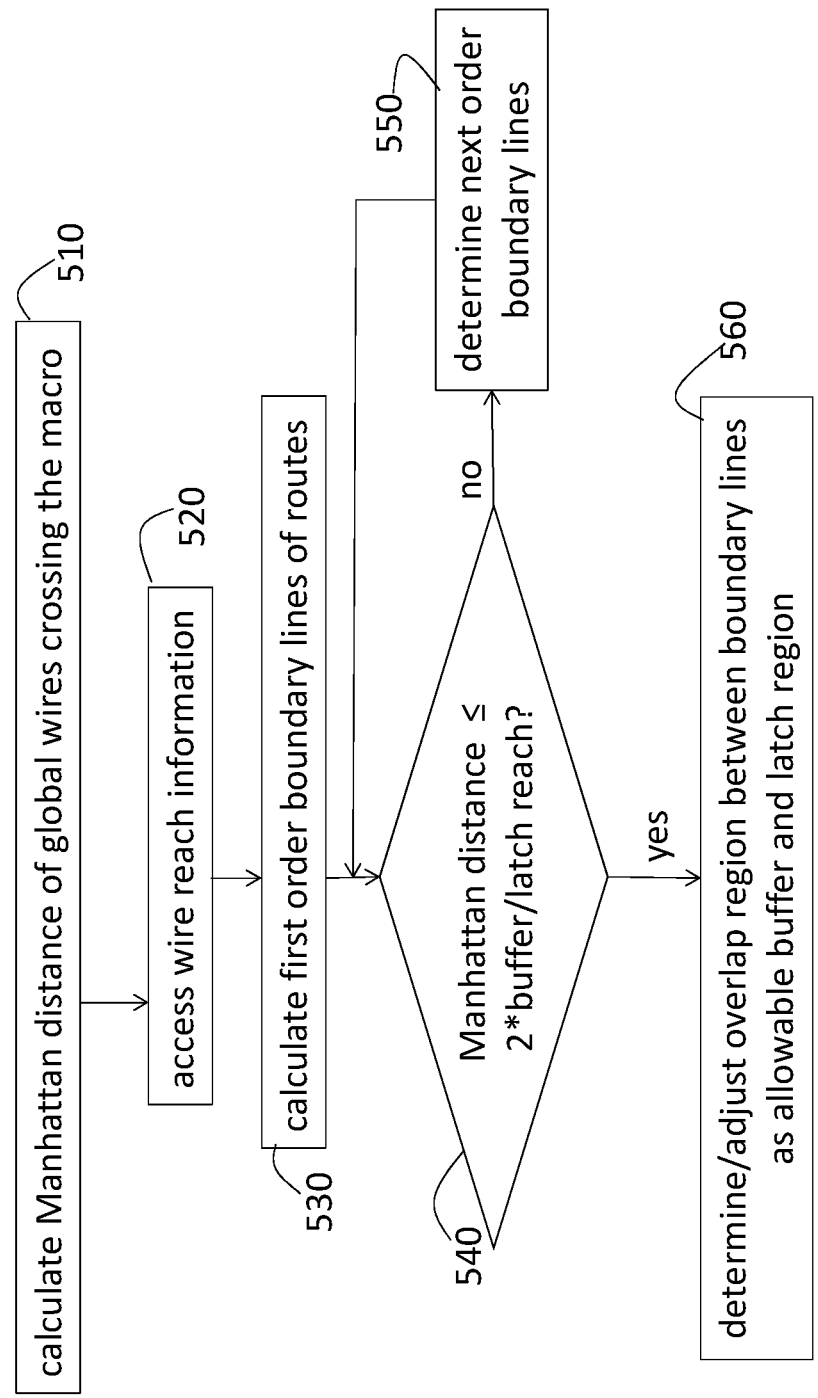
FIG. 5 details processes involved in performing wire reach analysis according to one or more embodiments.

FIG. 5 details processes involved in determining (at block 230) the allowable buffer and latch regions 730 according to one or more embodiments. These processes are further discussed with reference to FIGS. 6 and 7. At block 510, calculating the Manhattan distance 630 (FIG. 6) of global wires crossing the macro 145 refers to routing wires from sources 610 (FIG. 6) to sinks 620 (FIG. 6). Accessing wire reach information, at block 520, refers to using the information from the unit 140. This information is used to determine the maximum distances 641, 651 (FIG. 6) from the sources 610 to the buffers or latches and from the buffers or latches to the sinks 620, respectively. At block 530, the processes include calculating first order boundary lines 710, 720 (FIG. 7) of routes. This process is detailed with reference to FIG. 7. At block 540, a check is made of whether the Manhattan distance 630, which is calculated at block 510, is less than or equal to twice the buffer or latch reach, which is calculated at block 520. If it is not, then next order boundary lines are determined, at block 550, until the condition at block 540 is met. When the check at block 540 is passed, determining the overlap region between boundary lines 710, 720 is performed at block 560, as further discussed with reference to FIG. 7. Adjusting the overlap region first is sometimes necessary, as discussed with reference to FIG. 9. The overlap region represents the allowable buffer and latch region 730.

Figure 6A:
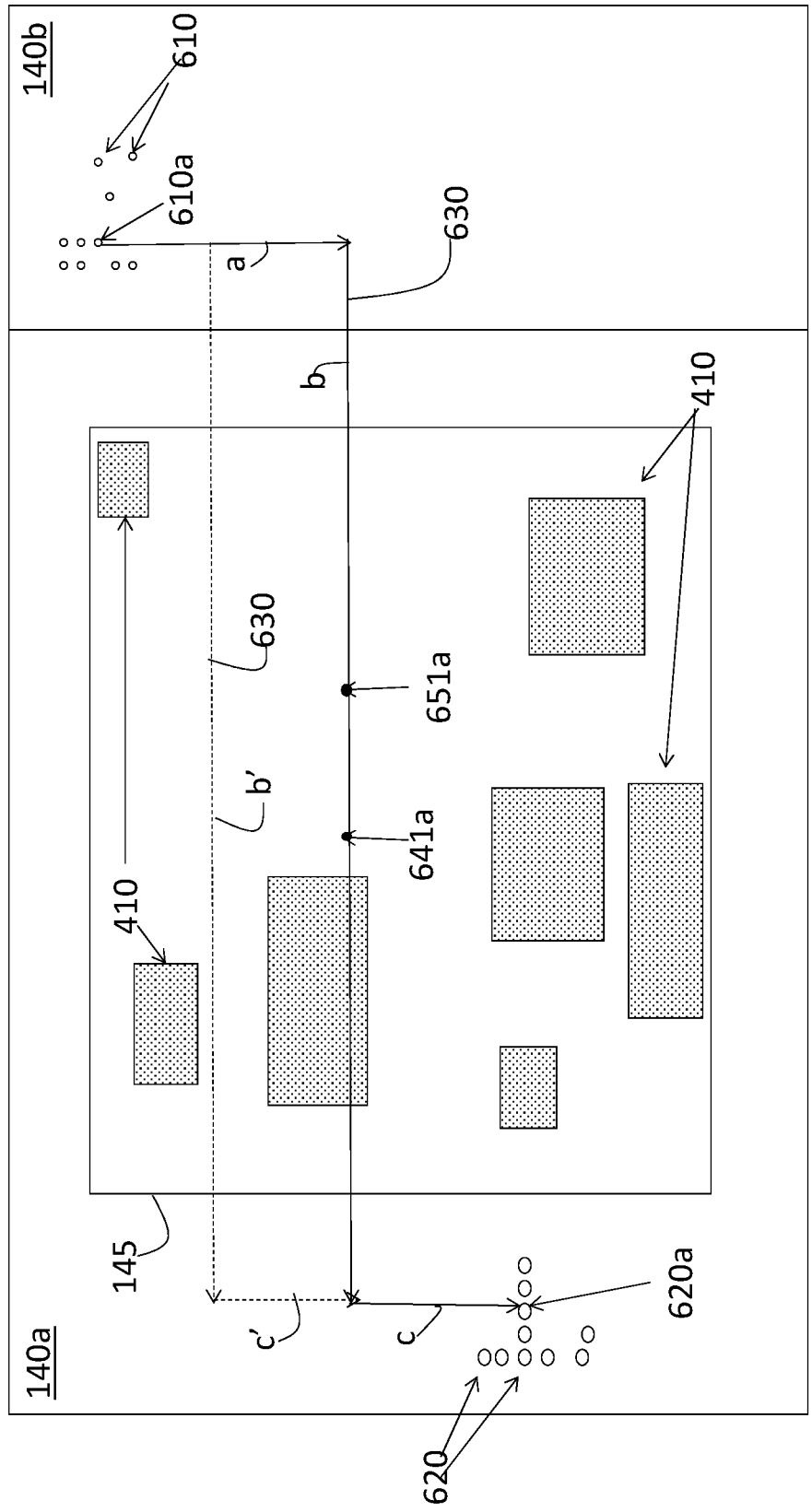
FIGS. 6a and 6b, collectively referred to as FIG. 6, illustrate aspects of the process of calculating the Manhattan distance of global wires crossing the macro according to one or more embodiments.
Figure 6B:
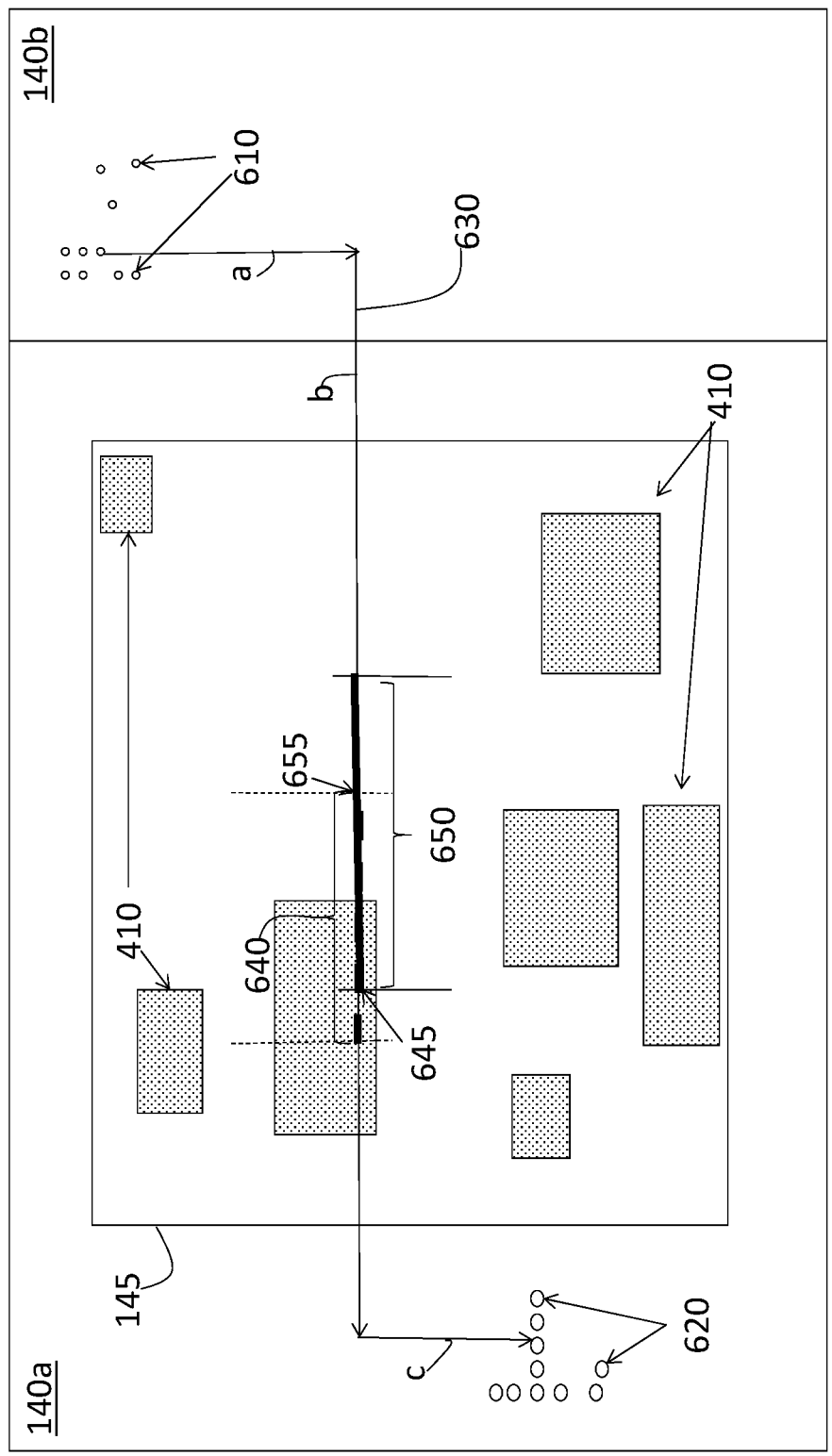

FIGS. 6a and 6b, collectively referred to as FIG. 6, illustrate some of the processes discussed with reference to FIG. 5 according to one or more embodiments. Two units 140a and 140b are shown in FIG. 6. Macro 145 is shown within unit 140a. A set of sources 610 are shown in unit 140b and one source 610a is indicated among the sources 610. A set of sinks 620 are shown in unit 140a, on the opposite side of macro 145 from the sources 610, and one sink 620a is indicated among the sinks 620. The exemplary positions of the sources 610 and sinks 620 in FIG. 6 are shown for explanatory purposes but the sources 610 and sinks 620 are not limited to being in different units 140 or even outside of the macro 145. The Manhattan distance 630, which is the sum of the lengths of the segments a, b, and c, between a given one of the sources 610 and a given one of the sinks 620 is indicated in FIG. 6. In FIG. 6a, the Manhattan distance 630, which does not change, is traversed differently with a segment shorter than segment a and segments b' and a combination of segments c' and c.

The wire reach information provided by the unit 140 is used to determine a maximum source 610 to buffer or latch distance 641 and a maximum buffer or latch to sink 620 distance 651 for a given source 610 and sink 620 pair. FIG. 6a shows the maximum source 610a to buffer or latch distance 641a and the maximum buffer or latch to sink 620a distance 651a. When the maximum distances 641 and 651 are found for every source 610 and sink 620 pair, a range 640 of source 620 to buffer or latch distances 641 and a range 650 of buffer or latch to sink 610 distances 651 are obtained, as shown in FIG. 6b. As previously noted, the maximum distances 641, 651 are determined, based on information provided by the unit 140, as wire distances that meet timing requirements like slew and delay. The values of interest to determine the boundary lines 710, 720 are two boundaries of the ranges 640, 650.

Specifically, the maximum distance 645 among the source 610 to buffer or latch maximum distances 641 in the range 640 is one of the values of interest. The other value of interest is the maximum distance 655 among the buffer or latch to sink 620 maximum distances 651 in the range 650. When the ranges 640, 650 overlap, it means that buffers or latches placed between the maximum distance 645 and the maximum distance 655 will not exceed wire reach limitations (i.e., the check at block 540 is passed). In that case, the maximum distance 645 and the maximum distance 655 are used to determine the boundary lines 710, 720, at block 530, as discussed with reference to FIG. 7.

However, when the buffers or latches cannot be placed between the maximum distance 645 and the maximum distance 655 (e.g., there is a gap between the maximum distance 645 and the maximum distance 655 that is not within the ranges 640, 650), it means that the Manhattan distance 630 is greater than twice the buffer or latch reach according to the check at block 540. In this case, multiple segments are needed and next order boundary lines 710, 720 are determined (at block 550). This is further discussed with reference to FIG. 8.

Figure 7:
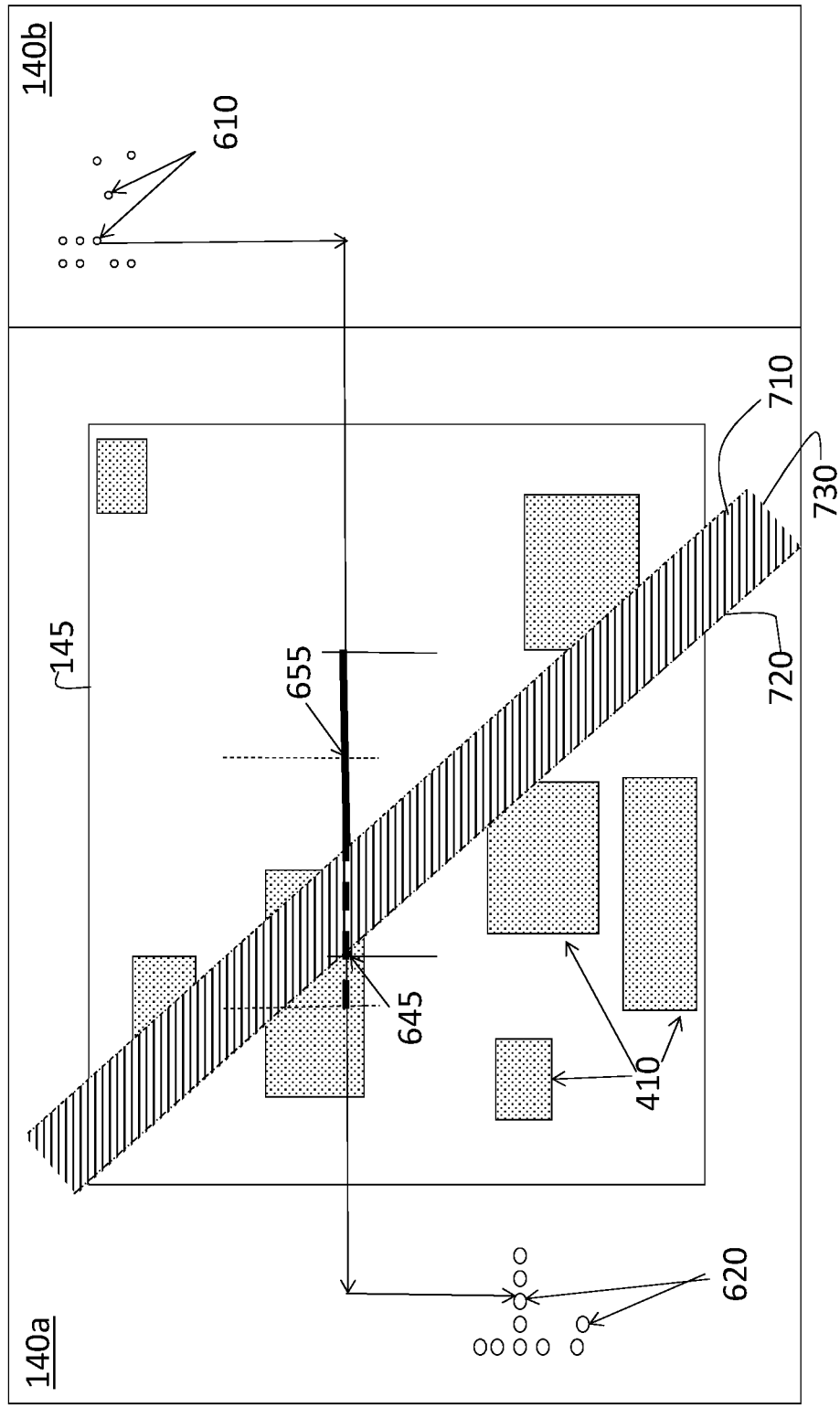
FIG. 7 shows an exemplary allowable buffer and latch region according to one or more embodiments.

FIG. 7 shows an exemplary allowable buffer and latch region 730 according to one or more embodiments. Once the maximum distances 645, 655 pass the check at block 540, the boundary lines 710, 720 are drawn based on the wire properties provided by the unit 140. When the wire properties are the same in the x and y directions, as in the exemplary case shown in FIG. 7, the boundary lines 710, 720 are drawn as 45 degree lines that respectively include the maximum distances 645, 655. The boundary line 710 connects maximum distance 645 on segments b and b' and the boundary line 720 connects maximum distance 655 on segments on b and b' in the exemplary segments shown in FIG. 6a. The allowable buffer and latch region 730 is the region between the boundary lines 710, 720, as indicated in FIG. 7.

When the wire properties are not the same in the x and y directions, as indicated by the unit 140, then the boundary lines 710, 720 must account for the difference in wire properties. That is, as previously noted, the Manhattan distance 630 between sources 610 and sinks 620 will not change but can be traversed in different ways. The regions 640, 650 and maximum distances 645, 655 will not necessarily be offset the same in the x and y directions for every traversal of the Manhattan distance 630 when the wire properties are not the same in the x and y directions. For example, the wire delay in the x direction can be smaller than the wire delay in the y direction due to variations in metal properties (e.g., thickness, width and distance between neighboring lines). As a result, a higher spatial variation in the x direction will still meet timing characteristics like slew and cycle time. Thus, the boundary line 710 connecting maximum distance 645 on segments b and b' will not be at a 45 degree angle, and the boundary line 720 connecting maximum distance 655 on segments b and b' will not be at a 45 degree angle.

Figure 8:
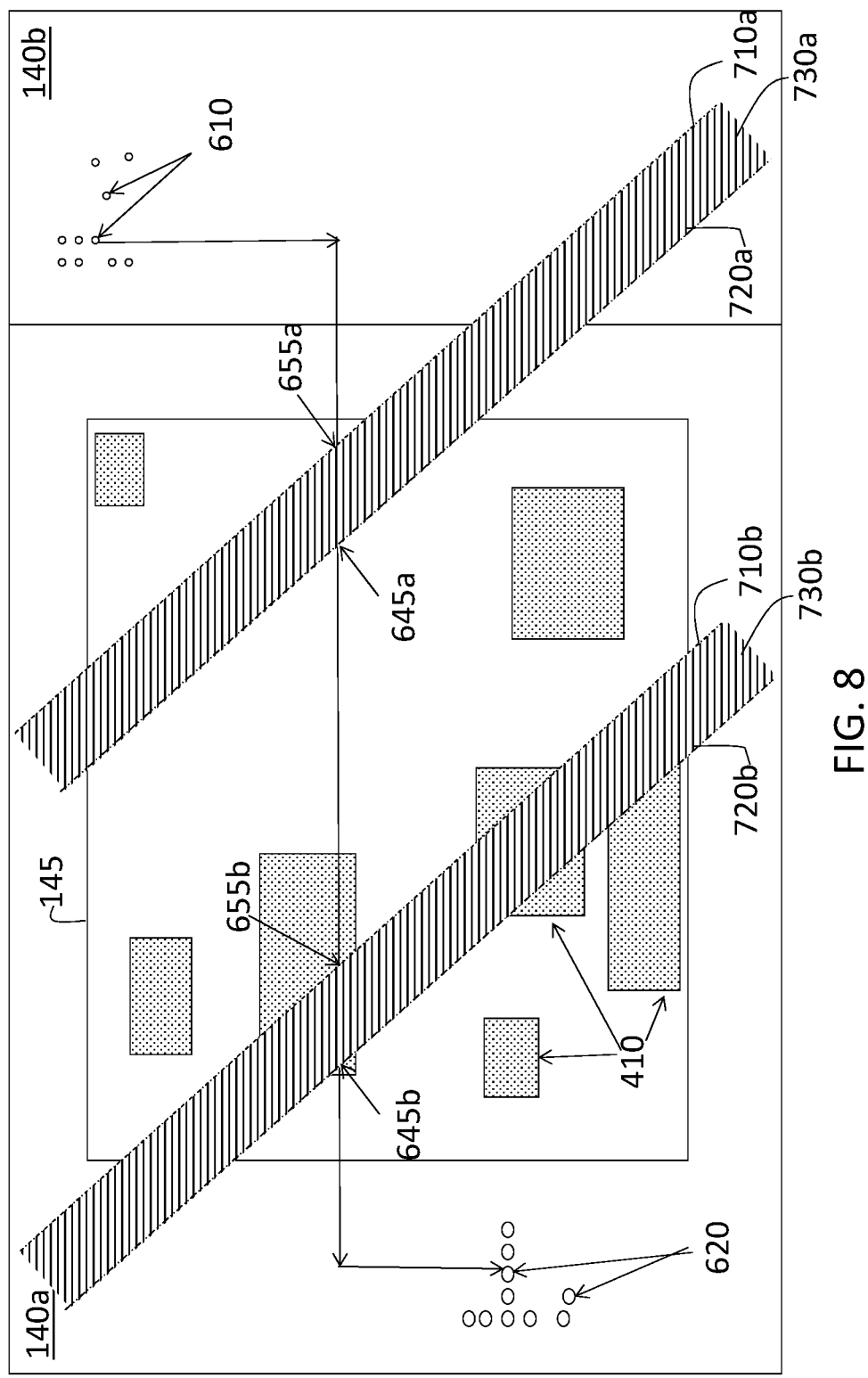
FIG. 8 shows exemplary allowable buffer and latch regions according to one or more alternate embodiments.

FIG. 8 shows exemplary allowable buffer and latch regions 730a, 730b according to one or more alternate embodiments. When the check at block 540 fails (i.e., the Manhattan distance 630 is greater than twice the buffer or latch reach), then the sources 610 cannot reach the sinks 620 through a single buffer or latch but must, instead, pass through multiple buffers or latch stages. As such, next order boundary lines must be determined (at block 550). The maximum distances 645a, 655a that define the boundary lines 710a, 720a that bound the allowable buffer and latch region 730a and the maximum distances 645b, 655b that define the boundary lines 710b, 720b that bound the allowable buffer and latch region 730b are found like the allowable buffer and latch region 730 that is discussed with reference to FIG. 7. However, in the case of maximum distance 655a, the distances the next set of buffers or latches (rather than to the sinks 620) is of interest, and in the case of maximum distance 645b, the distances from the first set of buffers or latches (rather than from the sources 610) is of interest.

Figure 9:
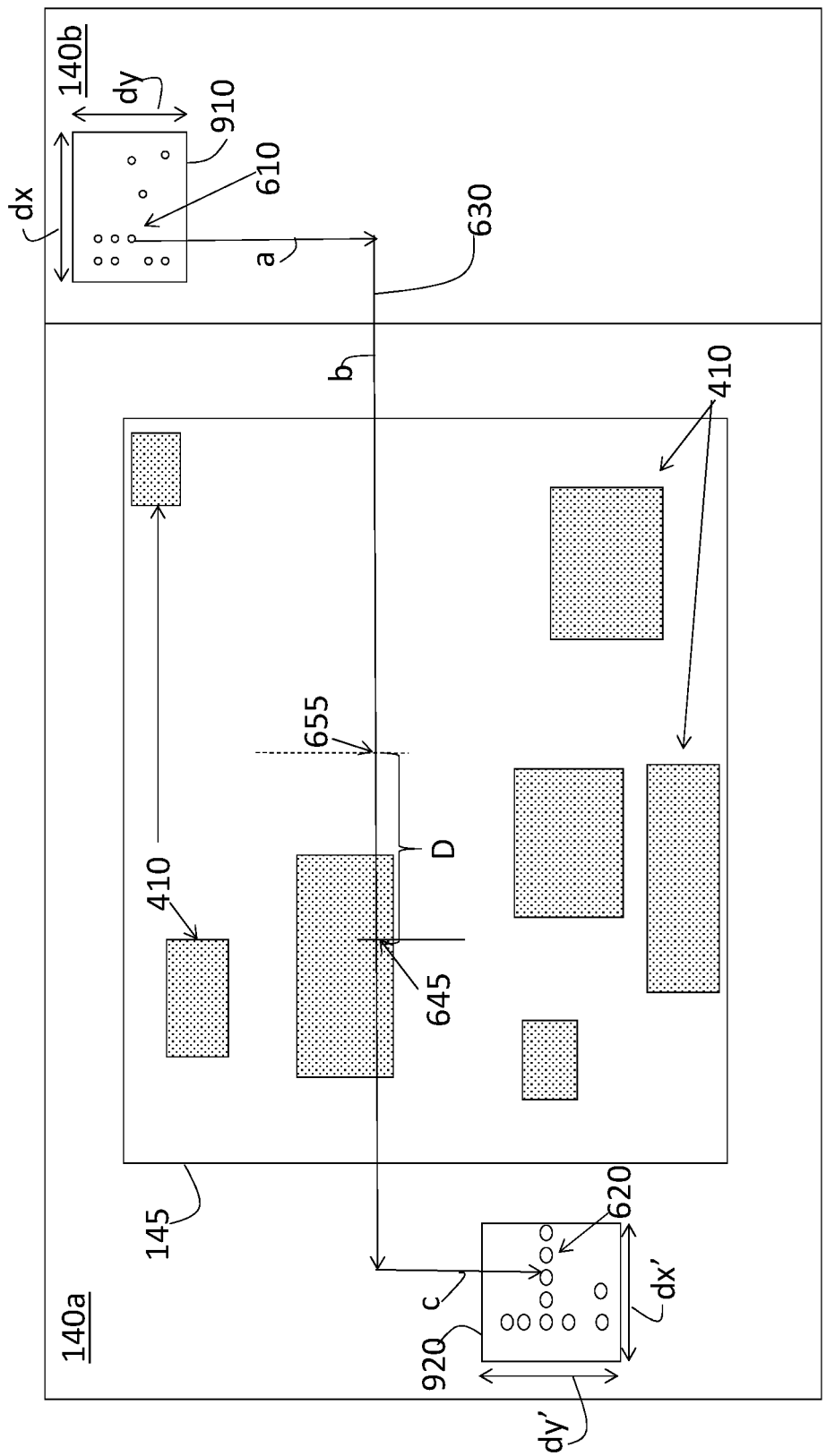
FIG. 9 illustrates aspects of the process used to derive buffer and latch placement reservation areas.

FIG. 9 shows aspects of the process (at block 240) used to derive buffer and latch placement reservation areas 1010. Specifically, FIG. 9 relates to the expansion of the overlap region between the boundary lines 710, 720 (block 560). The buffer and latch placement reservation areas 1010 (at block 240) that are determined according to the allowable buffer and latch region 730 must be sufficiently large to accommodate all the needed buffers and latches. Thus, the amount of area needed must first be determined and compared with the overlap region to determine if an expansion is needed. According to an embodiment, a determination of whether the overlap region needs to be expanded to accommodate all needed buffers and latches is based on a rectangle 910 drawn around the sources 610 and a rectangle 920 drawn around the sinks 920, as shown in FIG. 9. If the distance D between maximum distance 645 and maximum distance 655 is smaller than any of dx, dx', dy', or dy, then an expansion is needed to at least equal the maximum among the dimensions dx, dx', dy, and dy'. Once the amount of area needed is determined, then an overlap of the allowable buffer and latch region 730 and white spaces 410 is used to derive one or more buffer and latch placement reservation areas 1010.

Figure 10:
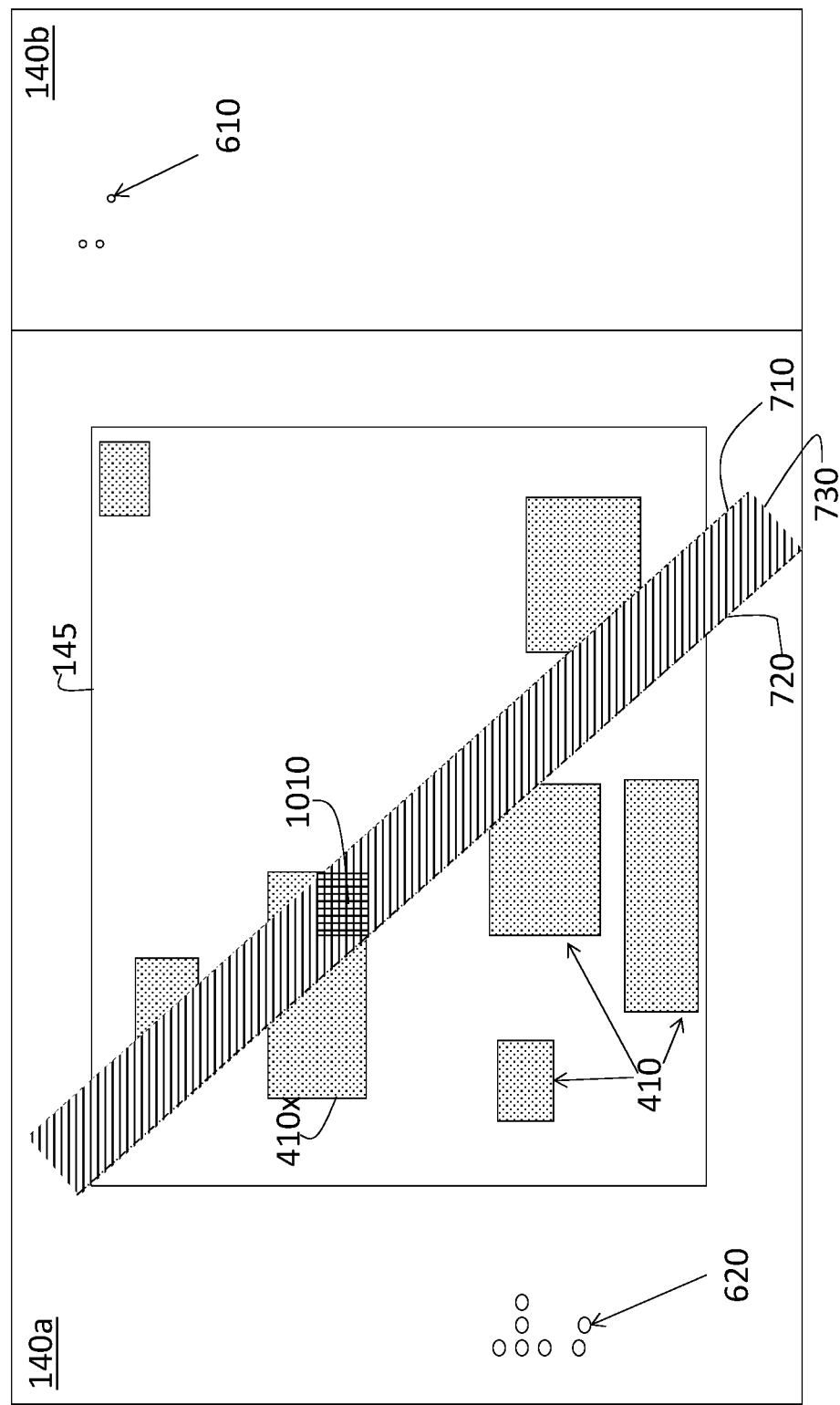
FIG. 10 shows an exemplary buffer and latch placement reservation area according to one or more embodiments.
Figure 11:
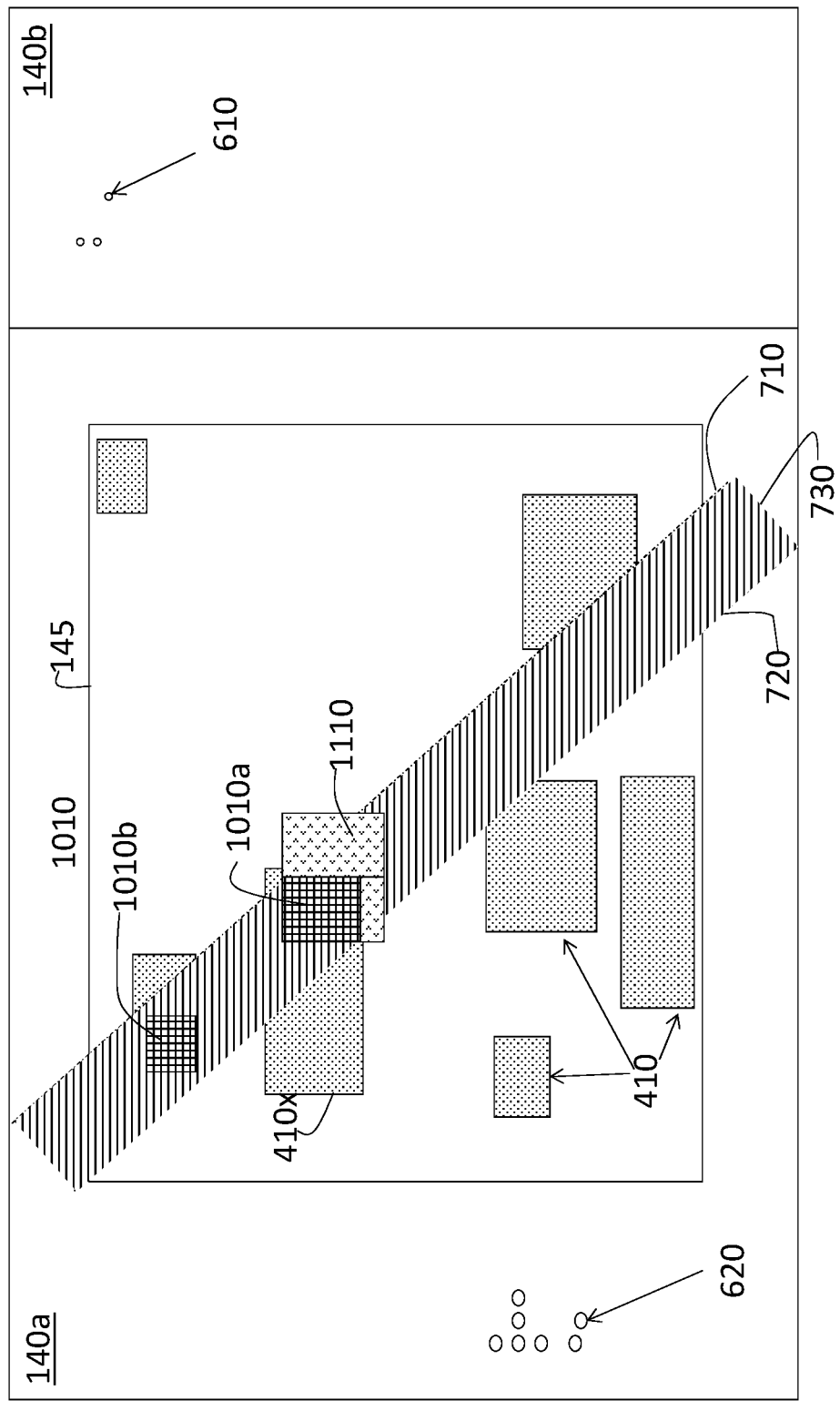
FIG. 11 shows buffer and latch placement reservation areas according to one or more embodiments.

FIG. 10 shows an exemplary buffer and latch placement reservation area 1010 according to one or more embodiments. In the exemplary case, the area needed for the buffers and latches fits entirely within the allowable buffer and latch region 730 and the white space 410x. FIG. 11 shows buffer and latch placement reservation areas 1010a, 1010b according to one or more embodiments. The buffer and latch placement reservation area 1010b is used to make up for the excess area 1110 needed for buffers and latches that does not fit in the white space 410x with buffer and latch placement reservation area 1010a.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of placing unit-level components in a macro within a unit of an integrated circuit that includes two or more of the units that each include two or more of the macros, the method comprising:
    detecting white space in a congestion plot of the macro, wherein the white space represents potential placement areas for the unit-level components;
    performing wire reach analysis between sources and sinks on different sides of the macro to determine an allowable region for the unit-level components;
    deriving a buffer and latch placement reservation area in which to place the unit-level components based on the white space and the allowable region; and
    generating a physical implementation of the integrated circuit based on the placing the unit-level components.

2. The method according to claim 1, wherein the detecting the white space includes identifying areas of the macro with utilization below a threshold value.

3. The method according to claim 1, further comprising obtaining wire reach information from the unit for the wire reach analysis.

4. The method according to claim 1, wherein determining the allowable region includes determining Manhattan distances from the sources to the sinks and determining the allowable region based on the wire reach analysis and the Manhattan distances.

5. The method according to claim 4, further comprising determining whether any of the Manhattan distances are greater than twice a buffer and latch wire reach.

6. The method according to claim 5, further comprising designating two or more allowable regions based on any of the Manhattan distances being greater than twice the buffer and latch wire reach.

7. The method according to claim 1, further comprising determining a needed area for the unit-level components.

8. The method according to claim 7, wherein the deriving the buffer and latch placement reservation area includes deriving two or more of the buffer and latch placement reservation areas when the needed area exceeds an area of intersection of the white space and the allowable region.

9. A system to place unit-level components in a macro within a unit of an integrated circuit that includes two or more of the units that each include two or more of the macros, the system comprising:
    a memory device configured to store a congestion plot of the macro; and
    a processor configured to detect white space in the congestion plot, perform wire reach analysis between sources and sinks on different sides of the macro to determine an allowable region for the unit-level components, and derive a buffer and latch placement reservation area in which to place the unit-level components based on the white space and the allowable region, wherein the white space represents potential placement areas for the unit-level components, wherein a physical implementation of the integrated circuit is generated based on placement of the unit-level components.

10. The system according to claim 9, wherein the processor detects the white space by identifying areas of the macro with utilization below a threshold value.

11. The system according to claim 9, wherein the processor determines the allowable region by determining Manhattan distances from the sources to the sinks and determines the allowable region based on the wire reach analysis and the Manhattan distances.

12. The system according to claim 11, wherein the processor determines whether any of the Manhattan distances are greater than twice a buffer and latch wire reach and designates two or more of the allowable regions based on any of the Manhattan distances being greater than twice the buffer and latch wire reach.

13. The system according to claim 9, wherein the processor determines a needed area for the unit-level components.

14. The system according to claim 13, wherein the processor derives two or more of the buffer and latch placement reservation areas when the needed area exceeds an intersection of the white space and the allowable region.

15. A computer program product for placing unit-level components in a macro within a unit of an integrated circuit that includes two or more of the units that each include two or more of the macros, the computer program product comprising a computer readable storage medium having program instructions embodied therewith, the program instructions executable by a processor to perform a method comprising:
    detecting white space in a congestion plot of the macro, wherein the white space represents potential placement areas for the unit-level components;
    performing wire reach analysis between sources and sinks on different sides of the macro to determine an allowable region for the unit-level components; and
    deriving a buffer and latch placement reservation area in which to place the unit-level components based on the white space and the allowable region, wherein a physical implementation of the integrated circuit is generated based on the placing the unit-level components.

16. The computer program product according to claim 15, wherein the detecting the white space includes identifying areas of the macro with utilization below a threshold value.

17. The computer program product according to claim 15, further comprising obtaining wire reach information from the unit for the wire reach analysis.

18. The computer program product according to claim 15, wherein determining the allowable region includes determining Manhattan distances from the sources to the sinks and determining the allowable region based on the wire reach analysis and the Manhattan distances.

19. The computer program product according to claim 18, further comprising determining whether the Manhattan distance is greater than twice a buffer and latch wire reach and designating two or more of the allowable regions based on the Manhattan distance being greater than twice the buffer and latch wire reach.

20. The computer program product according to claim 15, further comprising determining a needed area for the unit-level components, wherein the deriving the buffer and latch placement reservation area includes deriving two or more of the buffer and latch placement reservation areas when the needed area exceeds an intersection of the white space and the allowable region.

\* \* \* \* \*